(12) United States Patent
Park

(10) Patent No.: US 10,929,024 B2
(45) Date of Patent: *Feb. 23, 2021

(54) SOLID STATE DRIVE DEVICES AND STORAGE SYSTEMS HAVING THE SAME

(71) Applicant: Samsung Electronics Co., Ltd., Suwon-si (KR)

(72) Inventor: Ji-Woon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/556,567

(22) Filed: Aug. 30, 2019

(65) Prior Publication Data

US 2019/0384491 A1  Dec. 19, 2019

Related U.S. Application Data

(63) Continuation of application No. 15/644,743, filed on Jul. 8, 2017, now Pat. No. 10,402,099.

(30) Foreign Application Priority Data

Jul. 11, 2016 (KR) .................. 10-2016-0087280

(51) Int. Cl.
*G06F 3/06* (2006.01)
*G11C 7/10* (2006.01)
*H01L 25/065* (2006.01)

(52) U.S. Cl.
CPC ............ *G06F 3/061* (2013.01); *G06F 3/0611* (2013.01); *G06F 3/0655* (2013.01); *G06F 3/0656* (2013.01); *G06F 3/0688* (2013.01); *G11C 7/1003* (2013.01); *H01L 25/0655* (2013.01)

(58) Field of Classification Search
CPC ...... G06F 3/061; G06F 3/0611; G06F 3/0655; G06F 3/0656; G06F 3/0688; G11C 7/1003; H01L 25/0655
See application file for complete search history.

(56) References Cited

U.S. PATENT DOCUMENTS

| | | |
|---|---|---|
| 7,821,127 B2 | 10/2010 | Lee et al. |
| 8,060,774 B2 | 11/2011 | Smith et al. |
| 8,090,897 B2 | 1/2012 | Rajan et al. |
| 8,612,809 B2 | 12/2013 | Casper et al. |
| 8,619,452 B2 | 12/2013 | Rajan et al. |
| 8,631,193 B2 | 1/2014 | Smith et al. |
| 9,263,105 B2 | 2/2016 | Jeon et al. |

(Continued)

*Primary Examiner* — Richard Elms
*Assistant Examiner* — R Lance Reidlinger
(74) *Attorney, Agent, or Firm* — Muir Patent Law, PLLC

(57) ABSTRACT

A solid state drive (SSD) device includes a first nonvolatile memory package, a second nonvolatile memory package, and a controller. The first nonvolatile memory package includes a first buffer chip and a plurality of first nonvolatile memory chips. The second nonvolatile memory package includes a plurality of second nonvolatile memory chips. The controller controls the first nonvolatile memory package and the second nonvolatile memory package. The first buffer chip communicates a first address signal and a first data with the controller, and selectively communicates the first data with one of the plurality of first nonvolatile memory chips and the plurality of second nonvolatile memory chips based on the first address signal.

14 Claims, 11 Drawing Sheets

(56) References Cited

U.S. PATENT DOCUMENTS

| | | | |
|---|---|---|---|
| 10,402,099 B2* | 9/2019 | Park | G06F 3/0688 |
| 2010/0318718 A1 | 12/2010 | Eilert et al. | |
| 2012/0326746 A1 | 12/2012 | McCall et al. | |
| 2013/0119542 A1 | 5/2013 | Oh | |
| 2014/0351629 A1 | 11/2014 | Ware et al. | |
| 2014/0376295 A1 | 12/2014 | Oh et al. | |
| 2015/0046612 A1 | 2/2015 | Gupta | |
| 2016/0048466 A1 | 2/2016 | Rajan et al. | |

* cited by examiner

SOLID STATE DRIVE DEVICES AND STORAGE SYSTEMS HAVING THE SAME

CROSS-REFERENCE TO RELATED APPLICATION(S)

This application is a continuation of U.S. patent application Ser. No. 15/644,743, filed on Jul. 8, 2017, which claims priority under 35 USC § 119 to Korean Patent Application No. 10-2016-0087280, filed on Jul. 11, 2016 in the Korean Intellectual Property Office (KIPO), the contents of each of which are herein incorporated by reference in their entirety.

BACKGROUND

1. Technical Field

Example embodiments relate to a storage system, and more particularly to a solid state drive (SSD) device and a storage system including the SSD device.

2. Description of the Related Art

A hard disk drive (HDD) device is typically used as a data storage mechanism of an electronic device. Recently, however, a solid state drive (SSD) device including nonvolatile memory devices, such as flash memories, are being used instead of a HDD device as the data storage mechanisms of electronic devices.

A SSD device is advantageous over a HDD device because a SSD device does not include a mechanical device, such as a motor, and almost no heat and no noise are produced in a SSD device. In addition, a SSD device has advantages of fast access rate, high density, and high stability.

Generally, a SSD device includes a plurality of nonvolatile memory chips coupled to each of a plurality of channels. As a storage capacity of a SSD device increases, a number of nonvolatile memory chips coupled to each of the channels increases. However, when a number of nonvolatile memory chips coupled to each of the channels increases, a drive load of each channel increases, such that the operational speed of the SSD is lowered.

SUMMARY

Some example embodiments are directed to a solid state drive (SSD) device that increases operational speed while providing a large storage capacity.

Some example embodiments are directed to a storage system including the SSD device.

According to example embodiments, a solid state drive (SSD) device includes a first nonvolatile memory package, a second nonvolatile memory package, and a controller. The first nonvolatile memory package includes a first buffer chip and a plurality of first nonvolatile memory chips. The second nonvolatile memory package includes a plurality of second nonvolatile memory chips. The controller controls the first nonvolatile memory package and the second nonvolatile memory package. The first buffer chip communicates a first address signal and a first data with the controller, and selectively communicates the first data with one of the plurality of first nonvolatile memory chips and the plurality of second nonvolatile memory chips based on the first address signal.

According to example embodiments, a solid state drive (SSD) device includes a first nonvolatile memory package, a second nonvolatile memory package, a third nonvolatile memory package, a fourth nonvolatile memory package, and a controller. The first nonvolatile memory package includes a first buffer chip and a plurality of first nonvolatile memory chips. The second nonvolatile memory package includes a plurality of second nonvolatile memory chips. The third nonvolatile memory package includes a second buffer chip and a plurality of third nonvolatile memory chips. The fourth nonvolatile memory package includes a plurality of fourth nonvolatile memory chips. The controller controls the first nonvolatile memory package, the second nonvolatile memory package, the third nonvolatile memory package, and the fourth nonvolatile memory package. The first buffer chip communicates a first address signal and a first data with the controller, and selectively communicates the first data with one of the plurality of first nonvolatile memory chips and the plurality of second nonvolatile memory chips based on the first address signal. The second buffer chip communicates the first address signal and the first data with the controller, and selectively communicates the first data with one of the plurality of third nonvolatile memory chips and the plurality of fourth nonvolatile memory chips based on the first address signal.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
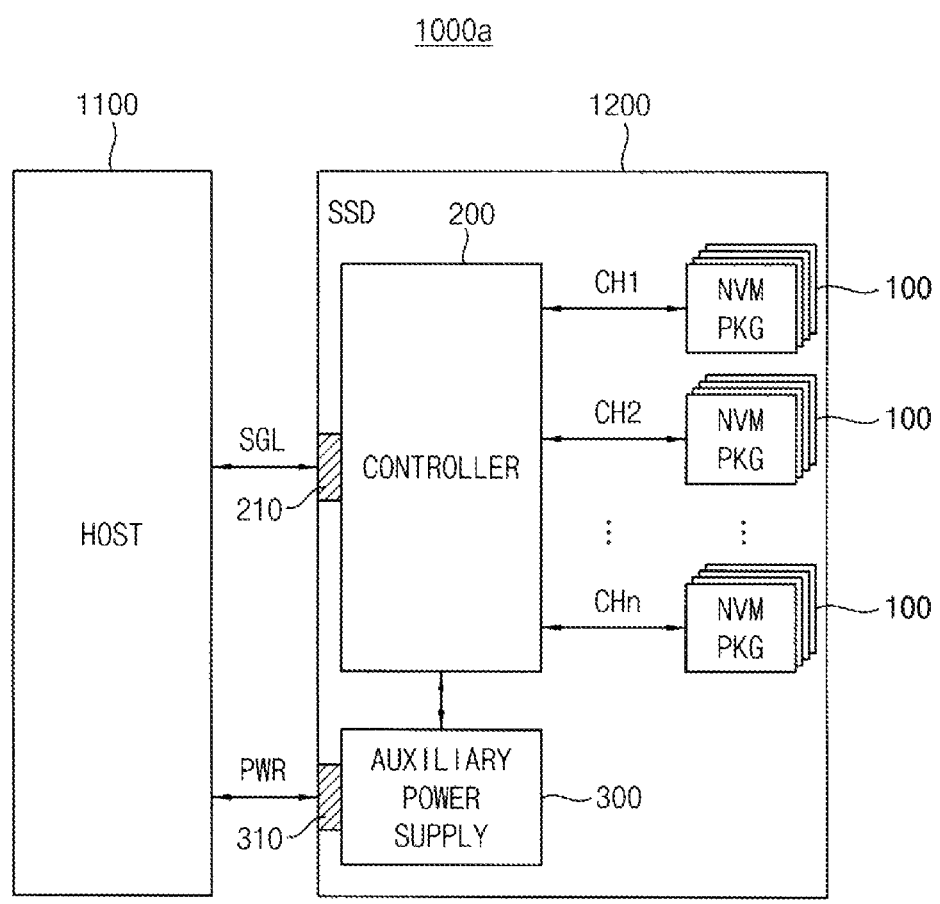
FIG. 1 is a block diagram illustrating a storage system according to example embodiments.

The present disclosure now will be described more fully hereinafter with reference to the accompanying drawings, in which various exemplary implementations are shown. The invention may, however, be embodied in many different forms and should not be construed as limited to the example embodiments. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary implementations, these figures are not necessarily intended to be mutually exclusive from each other. Rather, as will be seen from the context of the detailed description below, certain features depicted and described in different figures can be combined with other features from other figures to result in various exemplary embodiments, when taking the figures and their description as a whole into consideration.

Although the figures described herein may be referred to using language such as "one exemplary embodiment," or "certain exemplary embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Exemplary embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

FIG. 1 is a block diagram illustrating a storage system according to example embodiments.

As shown in FIG. 1, a storage system 1000a includes a host 1100 and a solid state drive (SSD) device 1200.

The SSD device 1200 may include a plurality of nonvolatile memory packages 100 and a controller 200.

The plurality of nonvolatile memory packages 100 may be used as a storage medium of the SSD device 1200.

In some example embodiments, each of the plurality of nonvolatile memory packages 100 may include a plurality of nonvolatile memory chips. In this case, each of the plurality of nonvolatile memory chips may include a flash memory.

The controller 200 may be coupled to the plurality of nonvolatile memory packages 100 through a plurality of channels CH1, CH2, . . . , CHn, respectively. Here, n represents a positive integer.

In some example embodiments, as illustrated in FIG. 1, each of the plurality of nonvolatile memory packages 100 may be coupled to the controller 200 through one respective channel.

The controller 200 may exchange a signal SGL with the host 1100 through a signal connector 210. The signal SGL may include a command, an address, and data. The controller 200 may perform a program operation and a read operation on the plurality of nonvolatile memory packages 100 according to the command received from the host 1100.

The SSD device 1200 may further include an auxiliary power supply 300. The auxiliary power supply 300 may receive power PWR from the host 1100 through a power connector 310 and provide power to the controller 200.

The auxiliary power supply 300 may be placed inside or outside the SSD device 1200. For example, the auxiliary power supply 300 may be placed in a main board and provide auxiliary power to the SSD device 1200.

In some example embodiments, the plurality of nonvolatile memory packages 100 and the controller 200 may be disposed or formed on the same printed circuit board (PCB). In this case, the plurality of nonvolatile memory packages 100 and the controller 200 may be coupled to each other through wirings of the PCB (e.g. within and/or on the surface of the PCB).

Features of the nonvolatile memory packages 100 may include a monolithic encapsulant, and external terminals, such as solder bumps, electrically connected to pads of the PCB. Thus, the PCB may contain separate and distinct nonvolatile memory packages with different encapsulates, and at different locations from a top down perspective of the PCB. Moreover, from a top down view, the PCB may have a size (area) substantially equal to the size (area) of the solid state drive.

Hereinafter, connections between the plurality of nonvolatile memory packages 100 and the controller 200 on the PCB will be described.

Figure 2:
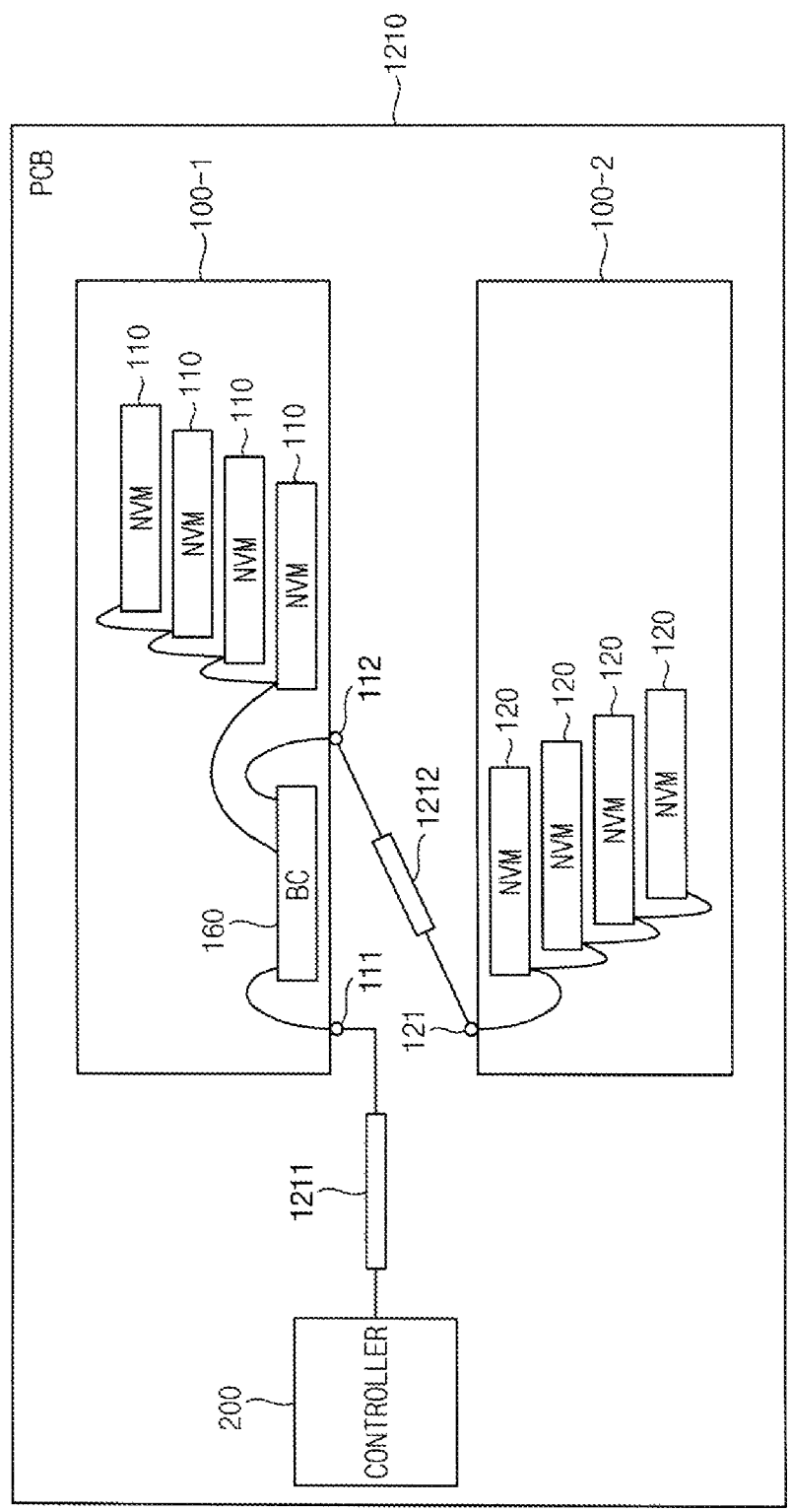
FIG. 2 is a diagram illustrating an example of a solid state drive (SSD) device included in the storage system of FIG. 1.

FIG. 2 is a diagram illustrating an example of a solid state drive (SSD) device included in the storage system of FIG. 1.

For ease of explanation, the controller 200 and two nonvolatile memory packages 100-1 and 100-2 coupled to the controller 200 through one same channel are illustrated in FIG. 2.

As illustrated in FIG. 2, the first nonvolatile memory package 100-1, the second nonvolatile memory package 100-2, and the controller 200 may be formed on the same PCB 1210.

The first nonvolatile memory package 100-1 may include a plurality of first nonvolatile memory chips NVM 110 and a first buffer chip BC 160. In some example embodiments, the plurality of first nonvolatile memory chips 110 may be accumulated on each other.

The second nonvolatile memory package 100-2 may include a plurality of second nonvolatile memory chips NVM 120. Contrary to the first nonvolatile memory package 100-1, the second nonvolatile memory package 100-2 may not include a buffer chip. In some example embodiments, the plurality of second nonvolatile memory chips 120 may be accumulated on each other.

Each of the plurality of first nonvolatile memory chips 110 and each of the plurality of second nonvolatile memory chips 120 may include a nonvolatile memory device.

The controller 200 may control the first nonvolatile memory package 100-1 and the second nonvolatile memory package 100-2 through one channel.

For example, during a program operation, the controller 200 may provide an address signal and a program data to the first buffer chip 160 included in the first nonvolatile memory package 100-1, and the first buffer chip 160 may selectively provide the program data to one of the plurality of first nonvolatile memory chips 110 included in the first nonvolatile memory package 100-1 and the plurality of second nonvolatile memory chips 120 included in the second nonvolatile memory package 100-2 based on the address signal.

For example, during a read operation, the controller 200 may provide the address signal to the first buffer chip 160 included in the first nonvolatile memory package 100-1, and the first buffer chip 160 may provide the address signal to a nonvolatile memory chip, which corresponds to the address signal, among the plurality of first nonvolatile memory chips 110 included in the first nonvolatile memory package 100-1 and the plurality of second nonvolatile memory chips 120 included in the second nonvolatile memory package 100-2. The nonvolatile memory chip, which receives the address signal from the first buffer chip 160, may provide read data to the first buffer chip 160, and the first buffer chip 160 may provide the read data to the controller 200.

Figure 3:
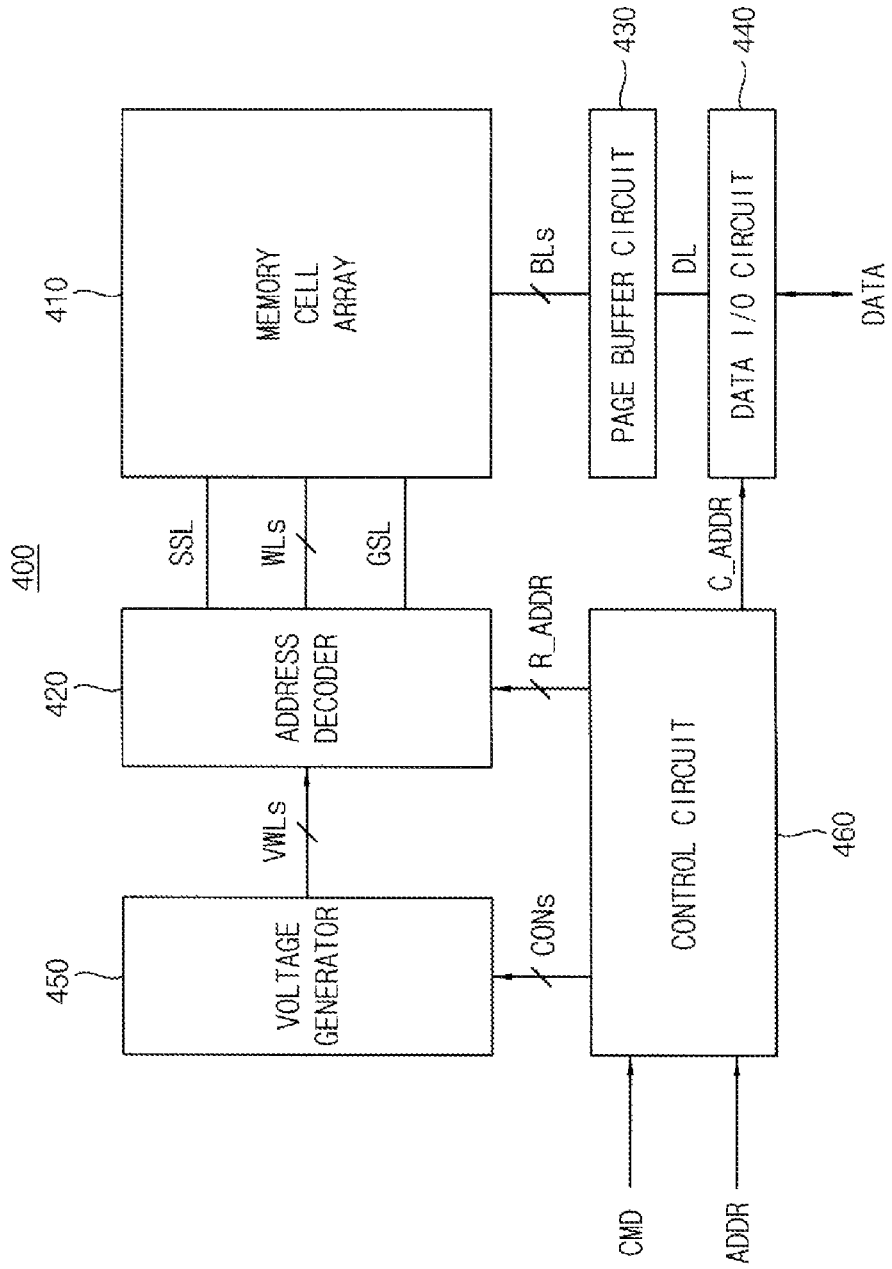
FIG. 3 is a block diagram illustrating an example of a nonvolatile memory device included in each of a plurality of first nonvolatile memory chips and each of a plurality of second nonvolatile memory chips of FIG. 2.

FIG. 3 is a block diagram illustrating an example of a nonvolatile memory device included in each of a plurality of first nonvolatile memory chips and each of a plurality of second nonvolatile memory chips of FIG. 2.

The nonvolatile memory device included in each of the plurality of first nonvolatile memory chips 110 and each of the plurality of second nonvolatile memory chips 120 may be implemented with a nonvolatile memory device 400 of FIG. 3.

As shown in FIG. 3, the nonvolatile memory device 400 may include a memory cell array 410, an address decoder 420, a page buffer circuit 430, a data input/output circuit 440, a voltage generator 450, and control circuit 460.

The memory cell array 410 may be coupled to the address decoder 420 through a string selection line SSL, a plurality of word lines WLs, and a ground selection line GSL. In addition, the memory cell array 410 may be coupled to the page buffer circuit 430 through a plurality of bit lines BLs.

The memory cell array 410 may include a plurality of memory cells coupled to the plurality of word lines WLs and the plurality of bit lines BLs.

In some example embodiments, the memory cell array 410 may be a three-dimensional memory cell array, which is formed on a substrate in a three-dimensional structure (or a vertical structure). In this case, the memory cell array 410 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other example embodiments, the memory cell array 410 may be a two-dimensional memory cell array, which is formed on a substrate in a two-dimensional structure (or a horizontal structure).

Figure 4:
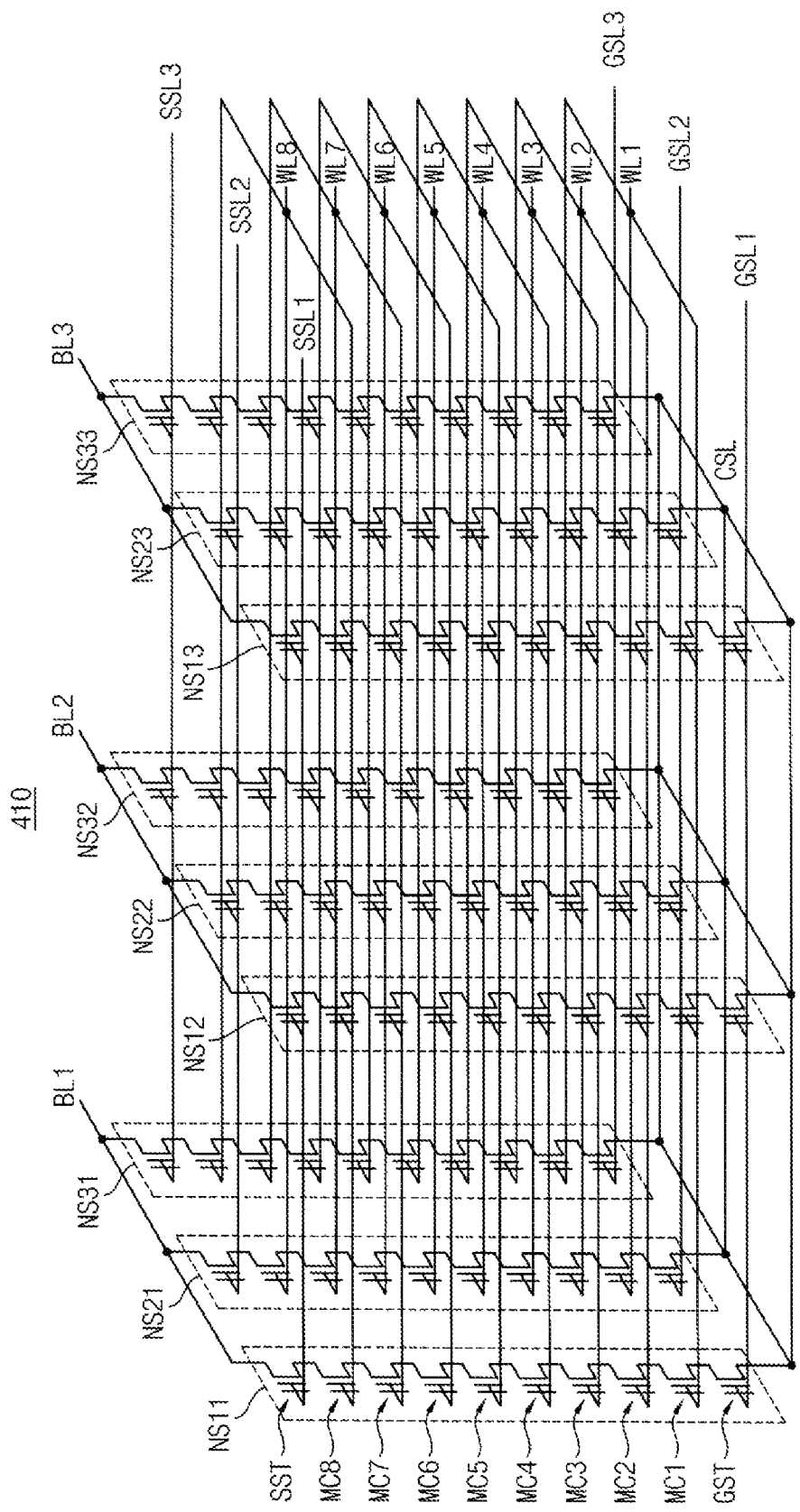
FIG. 4 is a circuit diagrams illustrating an example of a memory cell array included in the nonvolatile memory device of FIG. 3.

FIG. 4 is a circuit diagrams illustrating an example of a memory cell array included in the nonvolatile memory device of FIG. 3.

A memory cell array 410 of FIG. 4 may be formed on a substrate in a three-dimensional structure (or a vertical structure). For example, a plurality of memory cell strings included in the memory cell array 410 may be formed in a direction perpendicular to the substrate.

As shown in FIG. 4, the memory cell array 410 may include memory cell strings NS11 to NS33 coupled between bit lines BL1, BL2 and BL3 and a common source line CSL. Each of the memory cell strings NS11 to NS33 may include a string selection transistor SST, a plurality of memory cells MC1 to MC8, and a ground selection transistor GST.

In FIG. 4, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells.

Each string selection transistor SST may be connected to a corresponding string selection line SSL1 to SSL3. The plurality of memory cells MC1 to MC8 may be connected to corresponding word lines WL1 to WL8, respectively. Each ground selection transistor GST may be connected to a corresponding ground selection line GSL1 to GSL3. Each string selection transistor SST may be connected to a corresponding bit line BL1, BL2 and BL3, and each ground selection transistor GST may be connected to the common source line CSL.

Word lines (e.g., WL1) having the same height may be commonly connected, and the ground selection lines GSL1 to GSL3 and the string selection lines SSL1 to SSL3 may be separated.

In FIG. 4, the memory cell array 410 is illustrated to be coupled to eight word lines WL1 to WL8 and three bit lines BL1 to BL3. However, example embodiments are not limited thereto. In some example embodiments, the memory cell array 410 may be coupled to any number of world lines and bit lines.

As shown in FIG. 3, the control circuit 460 may receive a command signal CMD and an address signal ADDR from the first buffer chip 160, and control a program operation, a read operation, and an erase operation of the nonvolatile memory device 400 based on the command signal CMD and the address signal ADDR.

For example, the control circuit 460 may generate control signals CONs for controlling the voltage generator 450 based on the command signal CMD, and generate a row address R_ADDR and a column address C_ADDR based on the address signal ADDR. The control circuit 460 may provide the row address R_ADDR to the address decoder 420 and provide the column address C_ADDR to the data input/output circuit 440.

The address decoder 420 may be coupled to the memory cell array 410 through the string selection line SSL, the plurality of word lines WLs, and the ground selection line GSL.

During the program operation or the read operation, the address decoder 420 may determine one of the plurality of word lines WLs as a selected word line and determine rest of the plurality of word lines WLs except for the selected word line as unselected word lines based on the row address R_ADDR.

The voltage generator 450 may generate word line voltages VWLs, which are required for the operation of the nonvolatile memory device 400, based on the control signals CONs. The word line voltages VWLs may be applied to the plurality of word lines WLs through the address decoder 420.

During the program operation, the voltage generator 450 may generate a program voltage and a program pass voltage. The program voltage may be applied to the selected word line through the address decoder 420, and the program pass voltage may be applied to the unselected word lines through the address decoder 420.

In addition, during the read operation, the voltage generator 450 may generate a read voltage and a read pass voltage. The read voltage may be applied to the selected word line through the address decoder 420, and the read pass voltage may be applied to the unselected word lines through the address decoder 420.

The page buffer circuit 430 may be coupled to the memory cell array 410 through the plurality of bit lines BLs.

The page buffer circuit 430 may include a plurality of page buffers. In some example embodiments, one page buffer may be connected to one bit line. In other example embodiments, one page buffer may be connected to two or more bit lines.

The page buffer circuit 430 may temporarily store data to be programmed in a selected page or data read out from the selected page.

The data input/output circuit 440 may be coupled to the page buffer circuit 430 through data lines DL.

During the program operation, the data input/output circuit 440 may receive program data DATA from the first buffer chip 160 and provide the program data DATA to the page buffer circuit 430 based on the column address C_ADDR received from the control circuit 460.

During the read operation, the data input/output circuit 440 may provide read data DATA, which are stored in the page buffer circuit 430, to the first buffer chip 160 based on the column address C_ADDR received from the control circuit 460.

As shown in FIG. 2, the first buffer chip 160 may be coupled to the controller 200 through a first pad 111 of the first nonvolatile memory package 100-1 and a first wiring 1211 formed on the PCB 1210.

In addition, the first buffer chip 160 may be coupled to the plurality of first nonvolatile memory chips 110 through a wire bonding in the first nonvolatile memory package 100-1.

In addition, the first buffer chip 160 may be coupled to the plurality of second nonvolatile memory chips 120 through a second pad 112 of the first nonvolatile memory package 100-1, a second wiring 1212 formed on the PCB 1210, and a first pad 121 of the second nonvolatile memory package 100-2.

In one example, the first buffer chip 160 may comprise a lookup table storing a plurality of chip identification codes (CID) that identify a nonvolatile memory chip or group of nonvolatile memory chips. The address signal sent by the controller to the first buffer chip 160 may include a CID (as well as a location of memory within a chip). The first buffer chip 160 may compare a CID received from the controller as part of the address and compare the CID to CIDs stored in the look up table. The lookup table may output a control signal in response to a match of the received CID from the first buffer chip 160, such control signal being effective to determine where the address information will be retransmitted.

The look up table may be programmed to store the plurality of CIDs. For example, the look up table may include a fuse bank comprising a plurality of fuse sets that may be is programmed with appropriate CIDs during manufacturing of the SSD. Alternatively, the look up table may be programmed by the controller (e.g., during initialization) and comprise a plurality of registers (volatile or nonvolatile memory cells) each of which may store a CID.

Figure 5:
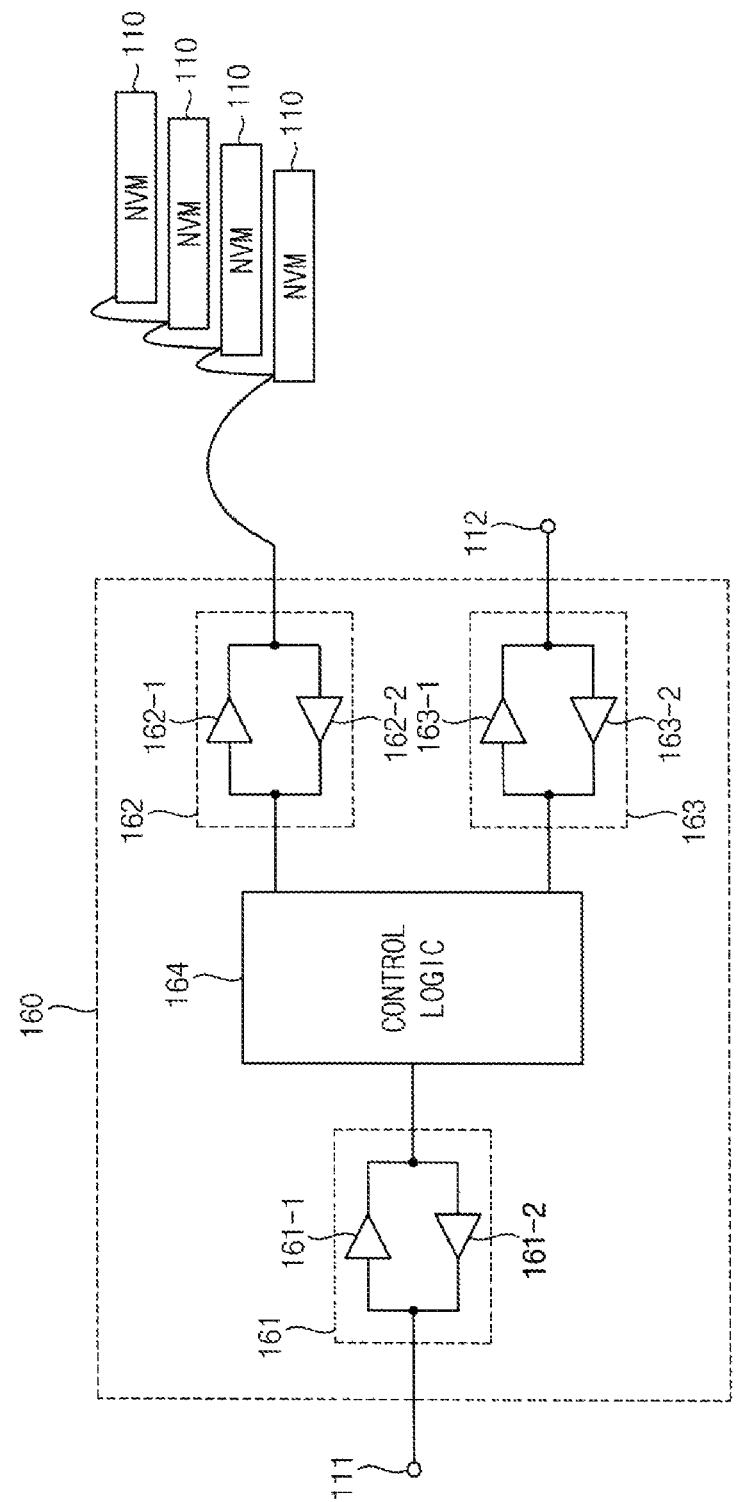
FIG. 5 is a block diagram illustrating an example of a first buffer chip included in a first nonvolatile memory package of FIG. 2.

FIG. 5 is a block diagram illustrating an example of a first buffer chip included in a first nonvolatile memory package of FIG. 2.

As shown in FIGS. 2 and 5, the first buffer chip 160 may include a first port 161, a second port 162, a third port 163, and a control logic 164.

The first port 161 may be coupled to the controller 200 through the first pad 111 of the first nonvolatile memory package 100-1 and the first wiring 1211 formed on the PCB 1210 to communicate the data DATA with the controller 200.

The second port 162 may be coupled to the plurality of first nonvolatile memory chips 110 through the wire bonding in the first nonvolatile memory package 100-1 to communicate the data DATA with the plurality of first nonvolatile memory chips 110. In some example embodiments, as illustrated in FIGS. 2 and 5, data transmission lines between the second port 162 and the plurality of first nonvolatile memory chips 110 may be coupled in a multi-drop topology.

The third port 163 may be coupled to the plurality of second nonvolatile memory chips 120 through the second pad 112 of the first nonvolatile memory package 100-1, the second wiring 1212 formed on the PCB 1210, and the first pad 121 of the second nonvolatile memory package 100-2 to communicate the data DATA with the plurality of second nonvolatile memory chips 120.

The control logic 164 may receive the data DATA from the controller 200 through the first port 161, and provide the data DATA to the plurality of first nonvolatile memory chips 110 included in the first nonvolatile memory package 100-1 through the second port 162 or to the plurality of second nonvolatile memory chips 120 included in the second nonvolatile memory package 100-2 through the third port 163.

In addition, the control logic 164 may receive the data DATA from the plurality of first nonvolatile memory chips 110 included in the first nonvolatile memory package 100-1 through the second port 162 or from the plurality of second nonvolatile memory chips 120 included in the second nonvolatile memory package 100-2 through the third port 163, and provide the data DATA to the controller 200 through the first port 161.

In some example embodiments, the first port 161 may include a first receiver 161-1 receiving the data DATA from the controller 200 and a first driver 161-2 providing the data DATA to the controller 200.

In some example embodiments, the second port 162 may include a second receiver 162-2 receiving the data DATA from the plurality of first nonvolatile memory chips 110 and a second driver 162-1 providing the data DATA to the plurality of first nonvolatile memory chips 110.

In some example embodiments, the third port 163 may include a third receiver 163-2 receiving the data DATA from the plurality of second nonvolatile memory chips 120 and a third driver 163-1 providing the data DATA to the plurality of second nonvolatile memory chips 120.

As described above, the first port 161 may be coupled to the controller 200 through the first pad 111 of the first nonvolatile memory package 100-1 and the first wiring 1211 formed on the PCB 1210, the second port 162 may be coupled to the plurality of first nonvolatile memory chips 110 through the wire bonding in the first nonvolatile memory package 100-1, and the third port 163 may be coupled to the plurality of second nonvolatile memory chips 120 through the second pad 112 of the first nonvolatile memory package 100-1, the second wiring 1212 formed on the PCB 1210, and the first pad 121 of the second nonvolatile memory package 100-2. Therefore, an optimum operation parameter of the first port 161, an optimum operation parameter of the second port 162, and an optimum operation parameter of the third port 163 may be different from each other.

Therefore, the control logic 164 may set an operation parameter of the first port 161, an operation parameter of the second port 162, and an operation parameter of the third port 163 independently from each other.

For example, since the second driver 162-1 included in the second port 162 is coupled to the plurality of first nonvolatile memory chips 110 through the wire bonding in the first nonvolatile memory package 100-1 while the third driver 163-1 included in the third port 163 is coupled to the plurality of second nonvolatile memory chips 120 through the second pad 112 of the first nonvolatile memory package 100-1, the second wiring 1212 formed on the PCB 1210, and the first pad 121 of the second nonvolatile memory package 100-2, a drive strength of the third driver 163-1 may be set to be greater than a drive strength of the second driver 162-1.

Figure 6:
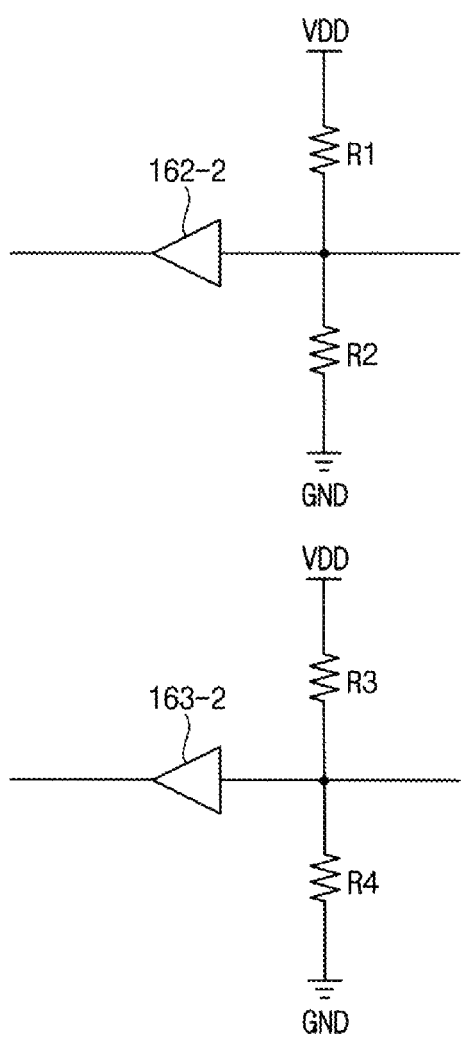
FIG. 6 is a circuit diagram illustrating an example of a connection of a second receiver and a connection of a third receiver of FIG. 5.

FIG. 6 is a circuit diagram illustrating an example of a connection of a second receiver and a connection of a third receiver of FIG. 5.

As illustrated in FIG. 6, on-die termination (ODT) resistors R1 and R2, which are coupled between a supply voltage VDD and a ground voltage GND, may be connected to an input electrode of the second receiver 162-2 included in the second port 162.

Similarly, ODT resistors R3 and R4, which are coupled between the supply voltage VDD and the ground voltage GND, may be connected to an input electrode of the third receiver 163-2 included in the third port 163.

In this case, since the second receiver 162-2 included in the second port 162 is coupled to the plurality of first nonvolatile memory chips 110 through the wire bonding in the first nonvolatile memory package 100-1 while the third receiver 163-2 included in the third port 163 is coupled to the plurality of second nonvolatile memory chips 120 through the second pad 112 of the first nonvolatile memory package 100-1, the second wiring 1212 formed on the PCB 1210, and the first pad 121 of the second nonvolatile memory package 100-2, resistances of the ODT resistors R1 and R2 of the second receiver 162-2 may be set independently from resistances of the ODT resistors R3 and R4 of the third receiver 163-2.

As described above with reference to FIGS. 1 to 6, the controller 200 may perform the program operation and the read operation on the first nonvolatile memory package 100-1 and the second nonvolatile memory package 100-2 by driving only a load of the first buffer chip 160. Therefore, the SSD device 1200 according to example embodiments may increase operational speed while providing a large storage capacity.

Figure 7:
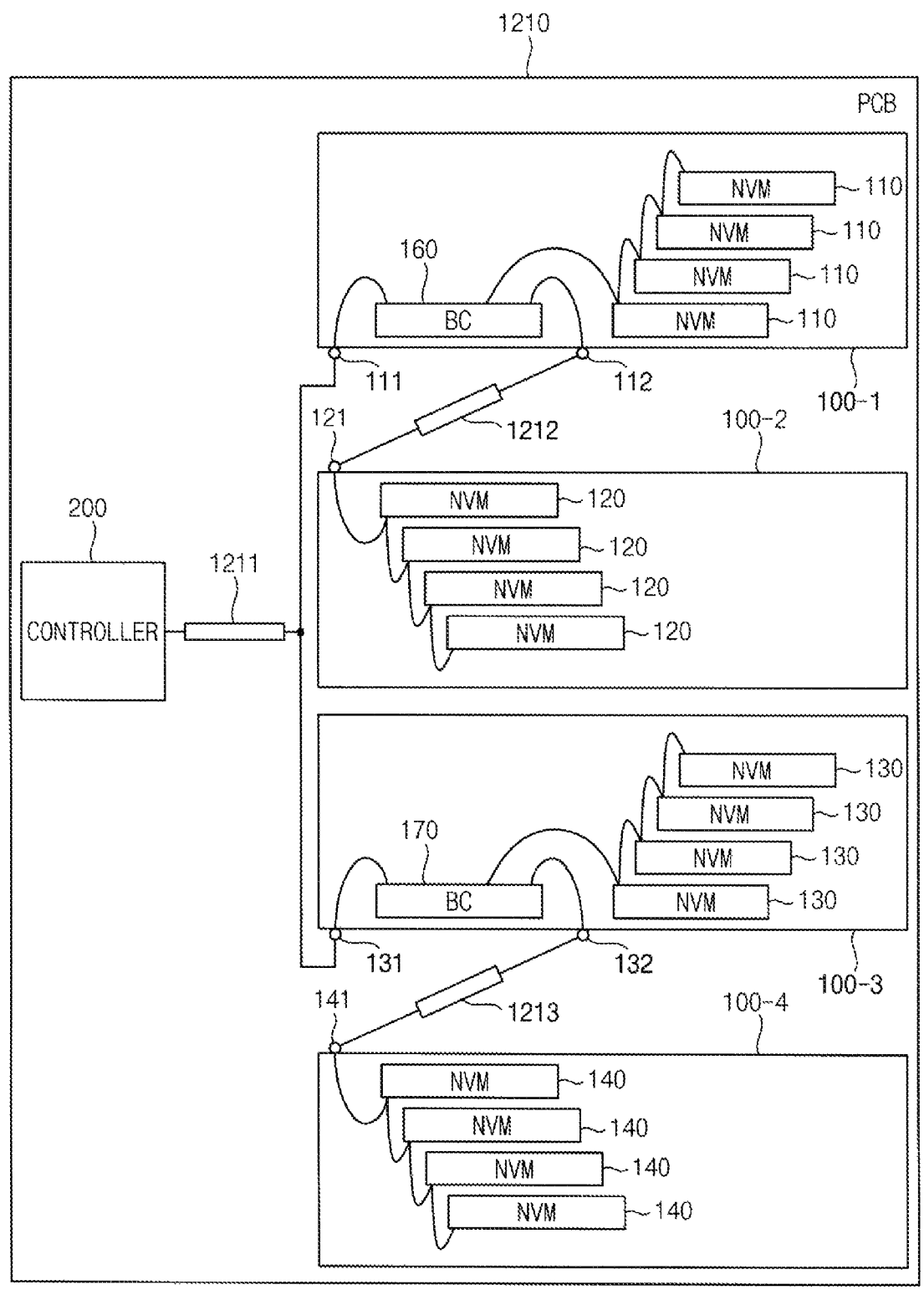
FIG. 7 is a diagram illustrating another example of the SSD device included in the storage system of FIG. 1.

FIG. 7 is a diagram illustrating another example of the SSD device included in the storage system of FIG. 1.

For ease of explanation, the controller 200 and four nonvolatile memory packages 100-1, 100-2, 100-3, and 100-4 coupled to the controller 200 through one same channel are illustrated in FIG. 7.

As illustrated in FIG. 7, the first nonvolatile memory package 100-1, the second nonvolatile memory package 100-2, the third nonvolatile memory package 100-3, the fourth nonvolatile memory package 100-4, and the controller 200 may be formed on the same PCB 1210.

The first nonvolatile memory package 100-1 may include a plurality of first nonvolatile memory chips NVM 110 and a first buffer chip BC 160. In some example embodiments, the plurality of first nonvolatile memory chips 110 may be accumulated on each other.

The second nonvolatile memory package 100-2 may include a plurality of second nonvolatile memory chips NVM 120. Contrary to the first nonvolatile memory package 100-1, the second nonvolatile memory package 100-2 may not include a buffer chip. In some example embodiments, the plurality of second nonvolatile memory chips 120 may be accumulated on each other.

The third nonvolatile memory package 100-3 may include a plurality of third nonvolatile memory chips NVM 130 and a second buffer chip BC 170. In some example embodiments, the plurality of third nonvolatile memory chips 130 may be accumulated on each other.

The fourth nonvolatile memory package 100-4 may include a plurality of fourth nonvolatile memory chips NVM 140. Contrary to the third nonvolatile memory package 100-3, the fourth nonvolatile memory package 100-4 may not include a buffer chip. In some example embodiments, the plurality of fourth nonvolatile memory chips 140 may be accumulated on each other.

Each of the plurality of first nonvolatile memory chips 110, each of the plurality of second nonvolatile memory chips 120, each of the plurality of third nonvolatile memory chips 130, and each of the plurality of fourth nonvolatile memory chips 140 may include a nonvolatile memory device.

The controller 200 may control the first nonvolatile memory package 100-1, the second nonvolatile memory package 100-2, the third nonvolatile memory package 100-3, and the fourth nonvolatile memory package 100-4 through one channel.

For example, during a program operation, the controller 200 may provide an address signal and a program data to the first buffer chip 160 included in the first nonvolatile memory package 100-1 and the second buffer chip 170 included in the third nonvolatile memory package 100-3 simultaneously. Based on the address signal, the first buffer chip 160 may selectively provide the program data to one of the plurality of first nonvolatile memory chips 110 included in the first nonvolatile memory package 100-1 and the plurality of second nonvolatile memory chips 120 included in the second nonvolatile memory package 100-2, or the second buffer chip 170 may selectively provide the program data to one of the plurality of third nonvolatile memory chips 130 included in the third nonvolatile memory package 100-3 and the plurality of fourth nonvolatile memory chips 140 included in the fourth nonvolatile memory package 100-4.

For example, during a read operation, the controller 200 may provide the address signal to the first buffer chip 160 included in the first nonvolatile memory package 100-1 and the second buffer chip 170 included in the third nonvolatile memory package 100-3 simultaneously. Based on the address signal, the first buffer chip 160 may provide the address signal to a nonvolatile memory chip, which corresponds to the address signal, among the plurality of first nonvolatile memory chips 110 included in the first nonvolatile memory package 100-1 and the plurality of second nonvolatile memory chips 120 included in the second nonvolatile memory package 100-2, or the second buffer chip 170 may provide the address signal to a nonvolatile memory chip, which corresponds to the address signal, among the plurality of third nonvolatile memory chips 130 included in the third nonvolatile memory package 100-3 and the plurality of fourth nonvolatile memory chips 140 included in the fourth nonvolatile memory package 100-4. The nonvolatile memory chip, which receives the address signal from the first buffer chip 160 or from the second buffer chip 170, may provide read data to the first buffer chip 160 or to the second buffer chip 170, and the first buffer chip 160 or the second buffer chip 170 may provide the read data to the controller 200.

As illustrated in FIG. 7, the first buffer chip 160 may be coupled to the controller 200 through a first pad 111 of the first nonvolatile memory package 100-1 and a first wiring 1211 formed on the PCB 1210.

In addition, the first buffer chip 160 may be coupled to the plurality of first nonvolatile memory chips 110 through a wire bonding in the first nonvolatile memory package 100-1.

In addition, the first buffer chip 160 may be coupled to the plurality of second nonvolatile memory chips 120 through a second pad 112 of the first nonvolatile memory package 100-1, a second wiring 1212 formed on the PCB 1210, and a first pad 121 of the second nonvolatile memory package 100-2.

The second buffer chip 170 may be coupled to the controller 200 through a first pad 131 of the third nonvolatile memory package 100-3 and the first wiring 1211 formed on the PCB 1210.

In addition, the second buffer chip 170 may be coupled to the plurality of third nonvolatile memory chips 130 through a wire bonding in the third nonvolatile memory package 100-3.

In addition, the second buffer chip 170 may be coupled to the plurality of fourth nonvolatile memory chips 140 through a second pad 132 of the third nonvolatile memory package 100-3, a third wiring 1213 formed on the PCB 1210, and a first pad 141 of the fourth nonvolatile memory package 100-4.

The first buffer chip 160 included in the first nonvolatile memory package 100-1 of FIG. 7 may be the same as the first buffer chip 160 included in the first nonvolatile memory package 100-1 of FIG. 2. Therefore, the first buffer chip 160 included in the first nonvolatile memory package 100-1 of FIG. 7 may be implemented with the first buffer chip 160 of FIG. 5.

Figure 8:
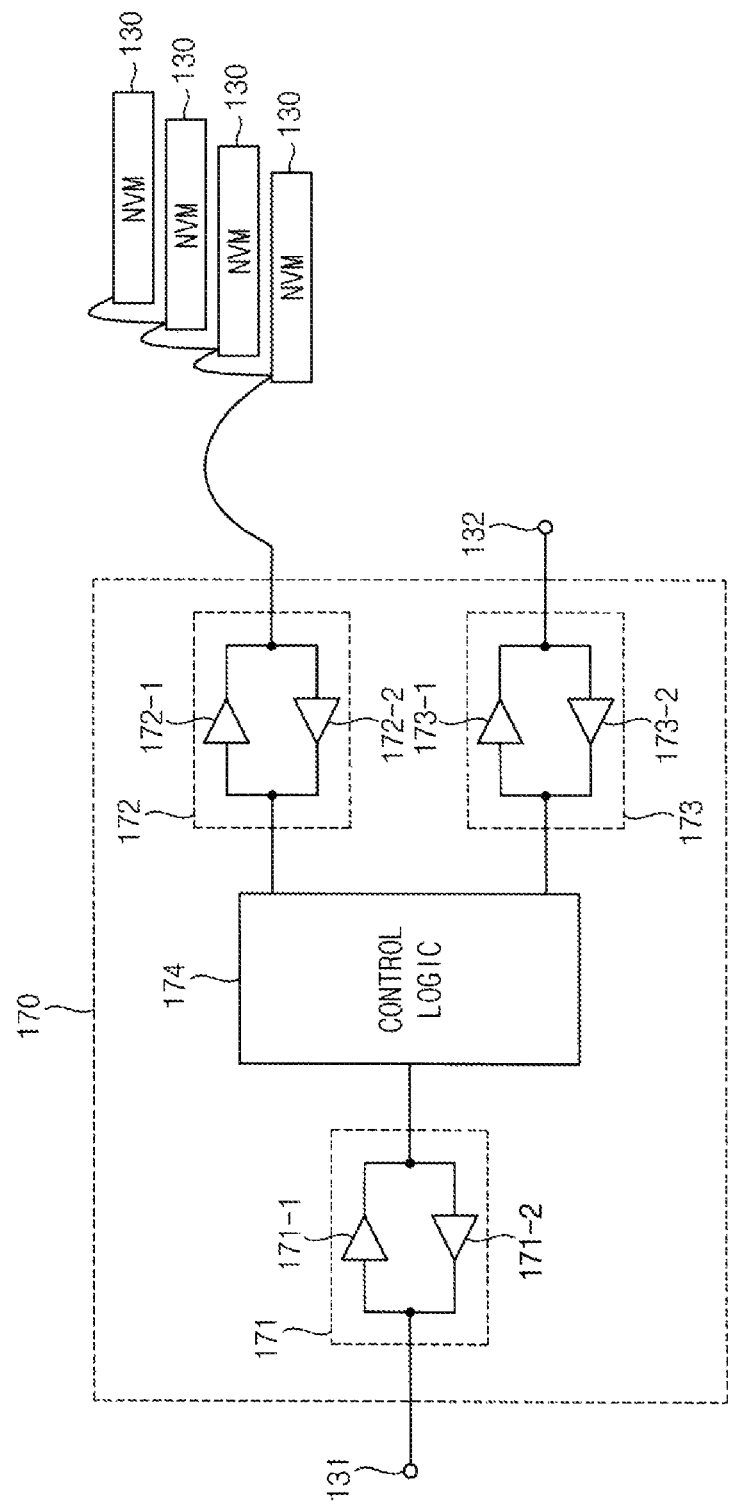
FIG. 8 is a block diagram illustrating an example of a second buffer chip included in a third nonvolatile memory package of FIG. 7.

FIG. 8 is a block diagram illustrating an example of a second buffer chip included in a third nonvolatile memory package of FIG. 7.

As shown in FIGS. 7 and 8, the second buffer chip 170 may include a first port 171, a second port 172, a third port 173, and a control logic 174.

The first port 171 may be coupled to the controller 200 through the first pad 131 of the third nonvolatile memory package 100-3 and the first wiring 1211 formed on the PCB 1210 to communicate the data DATA with the controller 200.

The second port 172 may be coupled to the plurality of third nonvolatile memory chips 130 through the wire bonding in the third nonvolatile memory package 100-3 to communicate the data DATA with the plurality of third nonvolatile memory chips 130. In some example embodiments, as illustrated in FIGS. 7 and 8, data transmission lines between the second port 172 and the plurality of third nonvolatile memory chips 130 may be coupled in a multi-drop topology.

The third port 173 may be coupled to the plurality of fourth nonvolatile memory chips 140 through the second pad 132 of the third nonvolatile memory package 100-3, the third wiring 1213 formed on the PCB 1210, and the first pad 141 of the fourth nonvolatile memory package 100-4 to communicate the data DATA with the plurality of fourth nonvolatile memory chips 140.

The control logic 174 may receive the data DATA from the controller 200 through the first port 171, and provide the data DATA to the plurality of third nonvolatile memory chips 110 included in the third nonvolatile memory package 100-3 through the second port 172 or to the plurality of fourth nonvolatile memory chips 140 included in the fourth nonvolatile memory package 100-4 through the third port 173.

In addition, the control logic 174 may receive the data DATA from the plurality of third nonvolatile memory chips 130 included in the third nonvolatile memory package 100-3 through the second port 172 or from the plurality of fourth nonvolatile memory chips 140 included in the fourth nonvolatile memory package 100-4 through the third port 173, and provide the data DATA to the controller 200 through the first port 171.

In some example embodiments, the first port 171 may include a first receiver 171-1 receiving the data DATA from the controller 200 and a first driver 171-2 providing the data DATA to the controller 200.

In some example embodiments, the second port 172 may include a second receiver 172-2 receiving the data DATA from the plurality of third nonvolatile memory chips 130 and a second driver 172-1 providing the data DATA to the plurality of third nonvolatile memory chips 130.

In some example embodiments, the third port 173 may include a third receiver 173-2 receiving the data DATA from the plurality of fourth nonvolatile memory chips 140 and a third driver 173-1 providing the data DATA to the plurality of fourth nonvolatile memory chips 140.

As described above, the first port 171 may be coupled to the controller 200 through the first pad 131 of the third nonvolatile memory package 100-3 and the first wiring 1211 formed on the PCB 1210, the second port 172 may be coupled to the plurality of third nonvolatile memory chips 130 through the wire bonding in the third nonvolatile memory package 100-3, and the third port 173 may be coupled to the plurality of fourth nonvolatile memory chips 140 through the second pad 132 of the third nonvolatile memory package 100-3, the third wiring 1213 formed on the PCB 1210, and the first pad 141 of the fourth nonvolatile memory package 100-4. Therefore, optimum operation parameters of the first port 171, the second port 172, and the third port 173 may be different from each other.

Therefore, the control logic 174 may set an operation parameter of the first port 171, an operation parameter of the second port 172, and an operation parameter of the third port 173 independently from each other.

For example, since the second driver 172-1 included in the second port 172 is coupled to the plurality of third nonvolatile memory chips 130 through the wire bonding in the third nonvolatile memory package 100-3 while the third driver 173-1 included in the third port 173 is coupled to the plurality of fourth nonvolatile memory chips 140 through the second pad 132 of the third nonvolatile memory package 100-3, the third wiring 1213 formed on the PCB 1210, and the first pad 141 of the fourth nonvolatile memory package 100-4, a drive strength of the third driver 173-1 may be set to be greater than a drive strength of the second driver 172-1.

Figure 9:
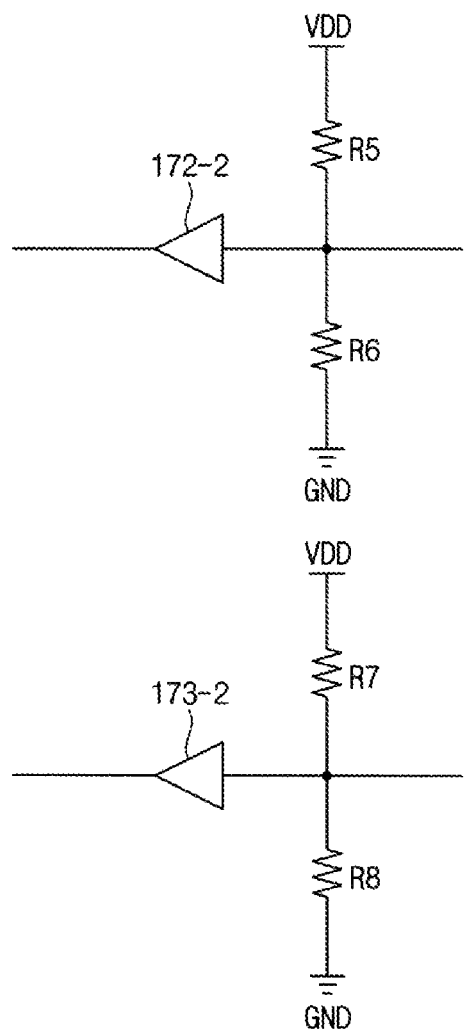
FIG. 9 is a circuit diagram illustrating an example of a connection of a second receiver and a connection of a third receiver of FIG. 8.

FIG. 9 is a circuit diagram illustrating an example of a connection of a second receiver and a connection of a third receiver of FIG. 8.

As illustrated in FIG. 9, on-die termination (ODT) resistors R5 and R6, which are coupled between a supply voltage VDD and a ground voltage GND, may be connected to an input electrode of the second receiver 172-2 included in the second port 172.

Similarly, ODT resistors R7 and R8, which are coupled between the supply voltage VDD and the ground voltage GND, may be connected to an input electrode of the third receiver 173-2 included in the third port 173.

In this case, since the second receiver 172-2 included in the second port 172 is coupled to the plurality of third nonvolatile memory chips 130 through the wire bonding in the third nonvolatile memory package 100-3 while the third receiver 173-2 included in the third port 173 is coupled to the plurality of fourth nonvolatile memory chips 140 through the second pad 132 of the third nonvolatile memory package 100-3, the third wiring 1213 formed on the PCB 1210, and the first pad 141 of the fourth nonvolatile memory package 100-4, resistances of the ODT resistors R5 and R6 of the second receiver 172-2 may be set independently from resistances of the ODT resistors R7 and R8 of the third receiver 173-2.

As described above, since the first nonvolatile memory package 100-1, the second nonvolatile memory package 100-2, the third nonvolatile memory package 100-3, and the fourth nonvolatile memory package 100-4 are coupled to the controller 200 through one same channel, the controller 200 may perform the program operation and the read operation on the plurality of first nonvolatile memory chips 110 and the plurality of second nonvolatile memory chips 120 using the first buffer chip 160, or perform the program operation and the read operation on the plurality of third nonvolatile memory chips 130 and the plurality of fourth nonvolatile memory chips 140 using the second buffer chip 170.

As described above and shown in FIGS. 1 and 7 to 9, the controller 200 may perform the program operation and the read operation on the first nonvolatile memory package 100-1, the second nonvolatile memory package 100-2, the third nonvolatile memory package 100-3, and the fourth nonvolatile memory package 100-4 by driving only a load of the first buffer chip 160 and a load of the second buffer chip 170. Therefore, the SSD device 1200 according to example embodiments may increase operational speed while having a large storage capacity.

Figure 10:
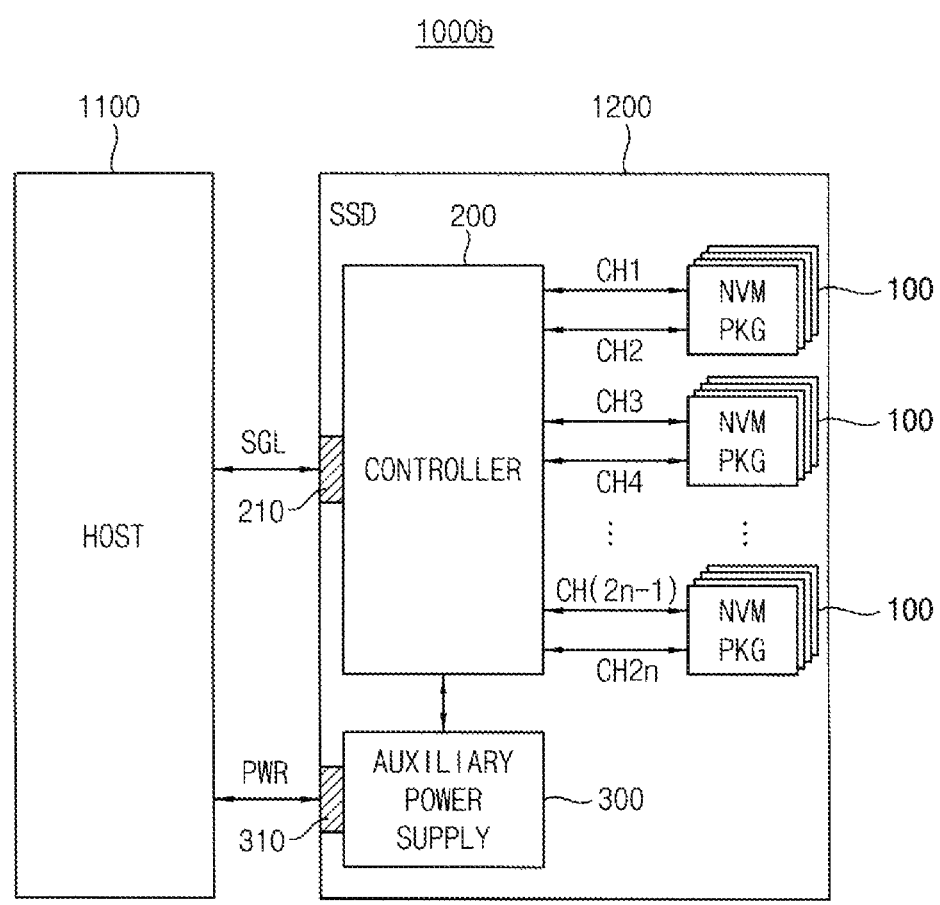
FIG. 10 is a block diagram illustrating a storage system according to example embodiments.

FIG. 10 is a block diagram illustrating a storage system according to example embodiments.

As shown in FIG. 10, a storage system 1000b includes a host 1100 and a SSD device 1200.

The SSD device 1200 may include a plurality of nonvolatile memory packages 100 and a controller 200.

The plurality of nonvolatile memory packages 100 may be used as a storage medium of the SSD device 1200.

In some example embodiments, each of the plurality of nonvolatile memory packages 100 may include a plurality of nonvolatile memory chips. In this case, each of the plurality of nonvolatile memory chips may include a flash memory.

The controller 200 may be coupled to the plurality of nonvolatile memory packages 100 through a plurality of channels CH1, CH2, . . . , CHn, respectively. Here, n represents a positive integer.

The SSD device 1200 of FIG. 10 is the same as the SSD device 1200 of FIG. 1 except that each of the plurality of nonvolatile memory packages 100 included in the SSD device 1200 of FIG. 10 is coupled to the controller 200 through two respective channels while each of the plurality of nonvolatile memory packages 100 included in the SSD device 1200 of FIG. 1 is coupled to the controller 200 through one respective channel. Therefore, duplicated description about the SSD device 1200 of FIG. 10 will be omitted here.

Figure 11:
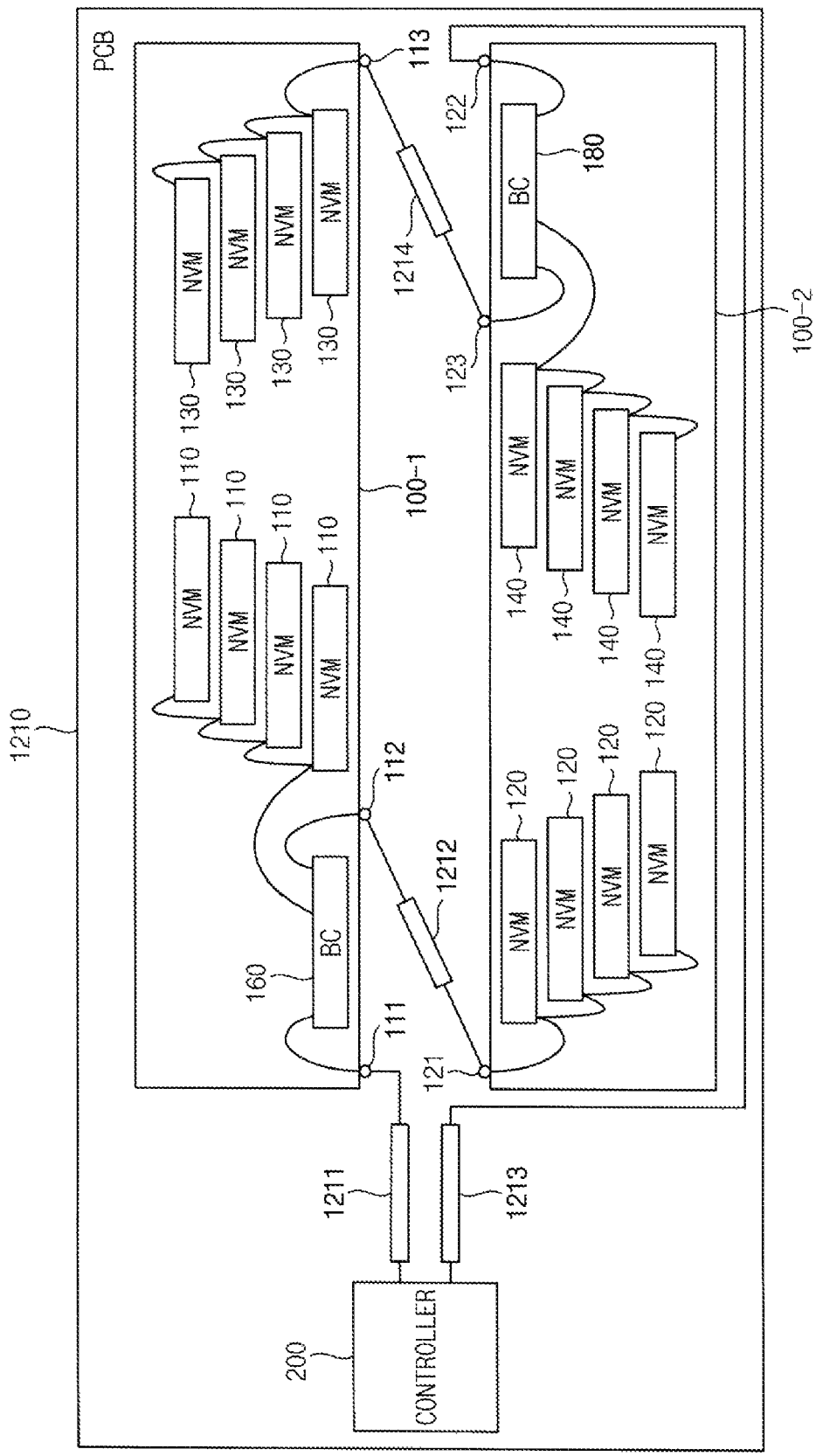
FIG. 11 is a diagram illustrating an example of a SSD device included in the storage system of FIG. 10.

FIG. 11 is a diagram illustrating an example of a SSD device included in the storage system of FIG. 10.

For ease of explanation, the controller 200 and two nonvolatile memory packages 100-1 and 100-2 coupled to the controller 200 through two same channels are illustrated in FIG. 11.

As illustrated in FIG. 11, the first nonvolatile memory package 100-1, the second nonvolatile memory package 100-2, and the controller 200 may be formed on a same PCB 1210.

The first nonvolatile memory package 100-1 may include a plurality of first nonvolatile memory chips NVM 110, a first buffer chip BC 160, and a plurality of third nonvolatile memory chips NVM 130.

The second nonvolatile memory package 100-2 may include a plurality of second nonvolatile memory chips NVM 120, a plurality of fourth nonvolatile memory chips NVM 140, and a second buffer chip BC 180.

Each of the plurality of first nonvolatile memory chips 110, each of the plurality of second nonvolatile memory chips 120, each of the plurality of third nonvolatile memory chips 130, and each of the plurality of fourth nonvolatile memory chips 140 may include a nonvolatile memory device.

The controller 200 may control the plurality of first nonvolatile memory chips 110 and the plurality of second nonvolatile memory chips 120 through a first channel, and control the plurality of third nonvolatile memory chips 130 and the plurality of fourth nonvolatile memory chips 140 through a second channel.

For example, during a program operation, the controller 200 may provide a first address signal and a first program data to the first buffer chip 160 included in the first nonvolatile memory package 100-1, and the first buffer chip 160 may selectively provide the first program data to one of the plurality of first nonvolatile memory chips 110 included in the first nonvolatile memory package 100-1 and the plurality of second nonvolatile memory chips 120 included in the second nonvolatile memory package 100-2 based on the first address signal. Independently from this operation, the controller 200 may provide a second address signal and a second program data to the second buffer chip 180 included in the second nonvolatile memory package 100-2, and the second buffer chip 180 may selectively provide the second program data to one of the plurality of third nonvolatile memory chips 130 included in the first nonvolatile memory package 100-1 and the plurality of fourth nonvolatile memory chips 140 included in the second nonvolatile memory package 100-2 based on the second address signal.

For example, during a read operation, the controller 200 may provide the first address signal to the first buffer chip 160 included in the first nonvolatile memory package 100-1, and the first buffer chip 160 may provide the first address signal to a nonvolatile memory chip, which corresponds to the first address signal, among the plurality of first nonvolatile memory chips 110 included in the first nonvolatile memory package 100-1 and the plurality of second nonvolatile memory chips 120 included in the second nonvolatile memory package 100-2. The nonvolatile memory chip, which receives the first address signal from the first buffer chip 160, may provide first read data to the first buffer chip 160, and the first buffer chip 160 may provide the first read data to the controller 200. Independently from this operation, the controller 200 may provide the second address signal to the second buffer chip 180 included in the second nonvolatile memory package 100-2, and the second buffer chip 180 may provide the second address signal to a nonvolatile memory chip, which corresponds to the second address signal, among the plurality of third nonvolatile memory chips 130 included in the first nonvolatile memory package 100-1 and the plurality of fourth nonvolatile memory chips 140 included in the second nonvolatile memory package 100-2. The nonvolatile memory chip, which receives the second address signal from the second buffer chip 180, may provide second read data to the second buffer chip 180, and the second buffer chip 180 may provide the second read data to the controller 200.

As illustrated in FIG. 11, the first buffer chip 160 may be coupled to the controller 200 through a first pad 111 of the first nonvolatile memory package 100-1 and a first wiring 1211 formed on the PCB 1210.

In addition, the first buffer chip 160 may be coupled to the plurality of first nonvolatile memory chips 110 through a wire bonding in the first nonvolatile memory package 100-1.

In addition, the first buffer chip 160 may be coupled to the plurality of second nonvolatile memory chips 120 through a second pad 112 of the first nonvolatile memory package 100-1, a second wiring 1212 formed on the PCB 1210, and a first pad 121 of the second nonvolatile memory package 100-2.

The second buffer chip 180 may be coupled to the controller 200 through a second pad 122 of the second nonvolatile memory package 100-2 and a third wiring 1213 formed on the PCB 1210.

In addition, the second buffer chip 180 may be coupled to the plurality of fourth nonvolatile memory chips 140 through a wire bonding in the second nonvolatile memory package 100-2.

In addition, the second buffer chip 180 may be coupled to the plurality of third nonvolatile memory chips 130 through a third pad 123 of the second nonvolatile memory package 100-2, a fourth wiring 1214 formed on the PCB 1210, and a third pad 113 of the first nonvolatile memory package 100-1.

The first buffer chip 160 included in the first nonvolatile memory package 100-1 of FIG. 11 and the second buffer chip 180 included in the second nonvolatile memory package 100-2 of FIG. 11 may be the same as the first buffer chip 160 included in the first nonvolatile memory package 100-1 of FIG. 2. Therefore, the first buffer chip 160 included in the first nonvolatile memory package 100-1 of FIG. 11 and the second buffer chip 180 included in the second nonvolatile memory package 100-2 of FIG. 11 may be implemented with the first buffer chip 160 of FIG. 5.

A structure and an operation of the first buffer chip 160 of FIG. 5 are described above with reference to FIGS. 1 to 6. Therefore, description about the first buffer chip 160 included in the first nonvolatile memory package 100-1 of FIG. 11 and the second buffer chip 180 included in the second nonvolatile memory package 100-2 of FIG. 11 will be omitted here.

As described above, since the plurality of first nonvolatile memory chips 110 and the plurality of second nonvolatile memory chips 120 are coupled to the controller 200 through one channel and the plurality of third nonvolatile memory chips 130 and the plurality of fourth nonvolatile memory chips 140 are coupled to the controller 200 through another channel, the controller 200 may perform the program operation and the read operation on the plurality of first nonvolatile memory chips 110 and the plurality of second nonvolatile memory chips 120 using the first buffer chip 160, and, independently, perform the program operation and the read operation on the plurality of third nonvolatile memory chips 130 and the plurality of fourth nonvolatile memory chips 140 using the second buffer chip 180.

As described above and shown in FIGS. 10 and 11, the controller 200 may perform the program operation and the read operation on the plurality of first nonvolatile memory chips 110 and the plurality of third nonvolatile memory chips 130 included in the first nonvolatile memory package 100-1 and the plurality of second nonvolatile memory chips 120 and the plurality of fourth nonvolatile memory chips 140 included in the second nonvolatile memory package 100-2 by driving only a load of the first buffer chip 160 and a load of the second buffer chip 180. Therefore, the SSD device 1200 according to example embodiments may increase operational speed while having a large storage capacity.

The foregoing exemplary embodiments are illustrative of the herein described subject matter and are not to be construed as limiting thereof. Although a few example embodiments have been described, those skilled in the art will readily appreciate that many modifications are possible in the example embodiments without materially departing from the novel teachings and advantages of the herein described subject matter. Accordingly, all such modifications are intended to be included within the scope of the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a solid state drive (SSD) device, wherein the SSD device includes a printed circuit board (PCB), a first nonvolatile memory package including a first buffer chip and a plurality of first nonvolatile memory chips disposed on the PCB, a second nonvolatile memory package including a plurality of second nonvolatile memory chips and a controller disposed on the PCB, the method comprising:
- connecting directly the controller to the first buffer chip through a first wiring link of the PCB;
- connecting directly the first buffer chip to the plurality of second nonvolatile memory chips through a second wiring link of the PCB that is not connected to the controller;
- communicating, by the controller, a first address signal and first data with the first buffer chip; and
- selectively communicating, by the first buffer chip, the first data with one of the plurality of first nonvolatile memory chips and the plurality of second nonvolatile memory chips based on the first address signal.

2. The method of claim 1, wherein all communication between the second nonvolatile memory package and the controller, is performed through the first buffer chip.

3. The method of claim 2, wherein selectively communicating includes:
- communicating the first data with the controller through a first port coupled to the controller;
- communicating the first data with the plurality of first nonvolatile memory chips through a second port coupled to the plurality of first nonvolatile memory chips; and
- communicating the first data with the plurality of second nonvolatile memory chips through a third port coupled to the plurality of second nonvolatile memory chips.

4. The method of claim 3, wherein the first port is coupled to the controller through a first pad of the first nonvolatile memory package and the first wiring link of the printed circuit board,
- the second port is coupled to the plurality of first nonvolatile memory chips through a wire bonding in the first nonvolatile memory package, and
- the third port is coupled to the plurality of second nonvolatile memory chips through a second pad of the first nonvolatile memory package, the second wiring link of the printed circuit board, and a first pad of the second nonvolatile memory package.

5. The method of claim 3, wherein selectively communicating further includes:
- receiving, by a first received in the first port, the first data from the controller;
- providing, by a first driver in the first port, the first data to the controller,
- receiving, by a second receiver in the second port, the first data from the plurality of first nonvolatile memory chips;
- providing, by a second driver in the second port, the first data to the plurality of first nonvolatile memory chips, and
- receiving, by a third receiver in the third port, the first data from the plurality of second nonvolatile memory chips; and
- providing, by a third driver in the third port, the first data to the plurality of second nonvolatile memory chips.

6. The method of claim 5, wherein selectively communicating further includes:
- controlling, by a control logic in the first buffer chip, the first port, the second port, and the third port that are independent of each other.

7. The method of claim 5, wherein a drive strength of the third driver is greater than a drive strength of the second driver.

8. The method of claim 5, wherein a resistance value of an on-die termination (ODT) resistor of the third receiver and a resistance value of an ODT resistor of the second receiver are independently set from each other.

9. The method of claim 2, wherein the first nonvolatile memory package further includes a plurality of third nonvolatile memory chips, and the second nonvolatile memory package further includes a second buffer chip and a plurality of fourth nonvolatile memory chips, further comprising:
- communicating by the second buffer chip, a second address signal and a second data with the controller; and
- selectively communicating, by the second buffer chip, the second data with one of the plurality of third nonvolatile memory chips and the plurality of fourth nonvolatile memory chips based on the second address signal.

10. The method of claim 9, wherein selectively communicating further includes:
- communicating the second data with the controller through a fourth port coupled to the controller;
- communicating the second data with the plurality of through fourth nonvolatile memory chips through a fifth port coupled to the plurality of fourth nonvolatile memory chips; and
- communicating the second data with the plurality of third nonvolatile memory chips through a sixth port coupled to the plurality of third nonvolatile memory chips.

11. The method of claim 10, wherein the fourth port is coupled to the controller through a second pad of the second nonvolatile memory package and a third wiring link on the printed circuit board,
- the fifth port is coupled to the plurality of fourth nonvolatile memory chips through a wire bonding in the second nonvolatile memory package, and
- the sixth port is coupled to the plurality of third nonvolatile memory chips through a third pad of the second nonvolatile memory package, a fourth wiring link on the printed circuit board, and a third pad of the first nonvolatile memory package.

12. A method of operating a solid state drive (SSD) device, wherein the SSD device includes a printed circuit board (PCB), at least two nonvolatile memory packages each of which including a plurality of nonvolatile memory chips, disposed on the PCB, and a first buffer chip, disposed on the PCB, associated with one of the at least two nonvolatile memory packages, the method comprising:
- connecting directly the first buffer chip to at least one other of the at least two nonvolatile memory packages;
- connecting the first buffer chip to a controller;
- communicating, by the first buffer chip, an address signal and data signals with the controller; and
- selectively communicating, by the first buffer chip, the data signal with one of the at least two nonvolatile memory packages based on the address signal,
- wherein the at least two nonvolatile memory packages includes a first group including two nonvolatile memory packages being operatively connected to the first buffer chip and a second group including two nonvolatile memory packages being operatively connected to a second buffer chip, and
- wherein the first buffer chip and the second buffer chip are independently connected to the controller through a first and a second channel, respectively.

13. A storage system, comprising:
- a host; and a solid state drive (SSD) device including a printed circuit board (PCB), a controller and at least a first nonvolatile memory package and a second nonvolatile memory package, wherein:

the first nonvolatile memory package including a first buffer chip and a plurality of first nonvolatile memory chips disposed on the PCB;

the second nonvolatile memory package including a plurality of second nonvolatile memory chips disposed on the PCB;

the controller, disposed on the PCB, configured to control the first nonvolatile memory package and the second nonvolatile memory package, the controller being directly connected to the first buffer chip by a first wiring link of the PCB;

the plurality of second nonvolatile memory chips of the second nonvolatile memory package is directly connected to the first buffer chip through a second wiring link of the PCB that is not connected to the controller; and the controller is configured to communicate a first address signal and first data with the first buffer chip, and the first buffer chip is configured to selectively communicate the first data with one of the plurality of first nonvolatile memory chips and the plurality of second nonvolatile memory chips based on the first address signal, and wherein the controller is configured to exchange the first address signal and first data though a signal connector.

14. The storage system of claim 13, wherein all communication between the second nonvolatile memory package, and the controller requires the first buffer chip, and wherein the first nonvolatile memory package further includes a plurality of third nonvolatile memory chips, the second nonvolatile memory package further includes a second buffer chip and a plurality of fourth nonvolatile memory chips, and the second buffer chip is configured to communicate a second address signal and a second data with the controller, and configured to selectively communicate the second data with one of the plurality of third nonvolatile memory chips and the plurality of fourth nonvolatile memory chips based on the second address signal.

* * * * *